(12) United States Patent
Kress

(10) Patent No.: US 8,532,154 B2
(45) Date of Patent: Sep. 10, 2013

(54) LASER DIODE ARRANGEMENT

(75) Inventor: Ekkehard Kress, Wasserburg (DE)

(73) Assignee: IIE GmbH & Co KG, Soyen (DE)

( * ) Notice: Subject to any disclaimer, the term of this patent is extended or adjusted under 35 U.S.C. 154(b) by 174 days.

(21) Appl. No.: 13/058,053

(22) PCT Filed: Aug. 31, 2009

(86) PCT No.: PCT/EP2009/061215
§ 371 (c)(1),
(2), (4) Date: Feb. 8, 2011

(87) PCT Pub. No.: WO2010/023314
PCT Pub. Date: Mar. 4, 2010

(65) Prior Publication Data
US 2013/0003764 A1    Jan. 3, 2013

(30) Foreign Application Priority Data

Sep. 1, 2008    (EP) .................................... 08105197

(51) Int. Cl.
*H01S 3/04*    (2006.01)
(52) U.S. Cl.
USPC ............. 372/35; 372/36; 372/50.12; 372/101
(58) Field of Classification Search
USPC .......................................................... 372/35
See application file for complete search history.

(56) References Cited

U.S. PATENT DOCUMENTS

| | | | | |
|---|---|---|---|---|
| 4,142,702 A | * | 3/1979 | Lamboo | 248/174 |
| 4,306,278 A | * | 12/1981 | Fulton et al. | 362/259 |
| 4,881,237 A | * | 11/1989 | Donnelly | 372/50.12 |
| 5,978,396 A | | 11/1999 | Duchemin et al. | |
| 6,172,997 B1 | * | 1/2001 | Miyake et al. | 372/36 |
| 6,647,035 B1 | | 11/2003 | Freitas et al. | |
| 6,865,199 B2 | * | 3/2005 | Miguelez et al. | 372/34 |
| 2002/0110165 A1 | * | 8/2002 | Filgas | 372/36 |
| 2006/0215715 A1 | * | 9/2006 | Kouta et al. | 372/36 |

FOREIGN PATENT DOCUMENTS

| | | | |
|---|---|---|---|
| DE | 102005040453 A1 | | 4/2006 |
| EP | 0973237 | * | 1/1998 |
| EP | 0973237 A1 | | 1/1998 |
| EP | 1450454 A1 | | 2/2004 |
| JP | 2001111176 A | | 4/2001 |
| JP | 2004193228 | | 9/2002 |
| JP | 2002344057 A | | 11/2002 |
| JP | 2004186212 A | | 7/2004 |

* cited by examiner

*Primary Examiner* — Xinning Niu
(74) *Attorney, Agent, or Firm* — Karl F. Milde, Jr.; Eckert Seamans Cherin & Mellott, LLC

(57) ABSTRACT

A laser diode arrangement having a multiplicity of laser diodes (11) arranged along side one another, comprises a heat sink (9) on which the laser diodes (11) are mounted and a cooling body (1) which is in intimate contact with the heat sink (9), wherein the cooling body (1) has two coolant channels (2; 3), which run parallel to the longitudinal axis of the heat sink (9) and are embodied as a feed channel (2) and as a discharge channel (3) for a coolant. According to the invention a multiplicity of cooling channels (5, 7; 6, 8) lying along side one another are provided, which branch off from the feed channel (2), lead past the heat sink (9), and open into the discharge channel (3), wherein cooling channels (5, 7; 6, 8) lying directly alongside one another branch off at different locations of the periphery of the feed channel (2) and of the discharge channel (3).

18 Claims, 2 Drawing Sheets

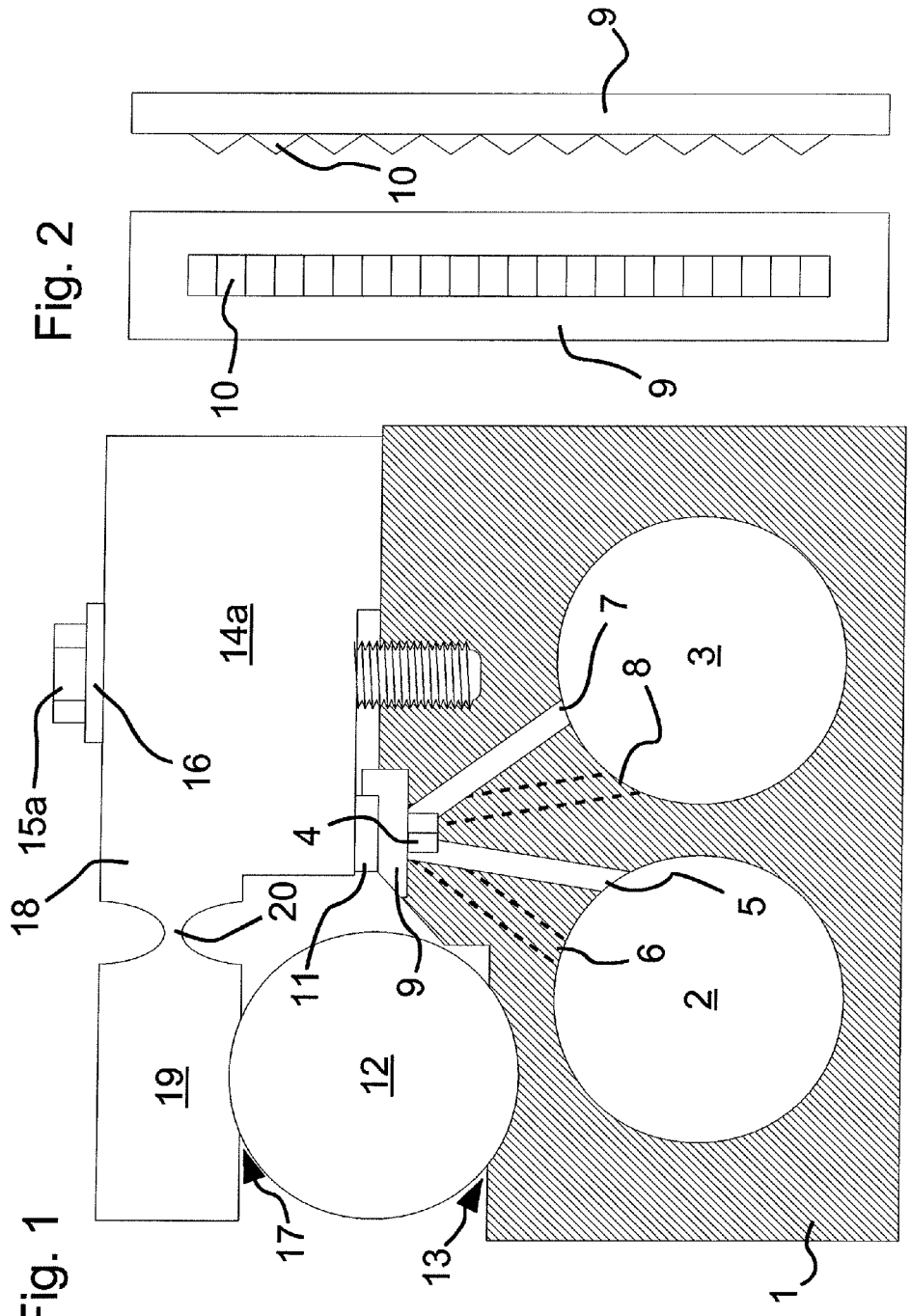

LASER DIODE ARRANGEMENT

BACKGROUND OF THE INVENTION

The invention relates to a laser diode arrangement having a heat sink with channels for liquid coolant.

To achieve great laser power using low-cost components, so-called "laser bars" are manufactured using wafer technology. Such bars are formed by strip-shaped chips that comprise several individual emitters adjacent to each other. The individual emitters are electrically connected in parallel. Usually, the strip-shaped chip is mounted on a heat sink.

A laser bar may contain approx. 50 individual emitters, each of them emitting one laser beam that exhibits a beam angle of approx. 40° in one direction (fast axis) and of approx. 12° in the other direction (slow axis). Using collimation lenses, the individual beams are combined and parallelized.

To achieve even greater laser power, such bars are arranged to form so-called "stacks". Depending on the application, both horizontal and vertical stacks have been known. Typically, the individual laser bars are electrically switched in series in these stacks. Such stacks are capable of generating an optical power of approx. 1 kW. Due to the high packing and power density, the individual bars are in turn mounted on heat sinks. To achieve a high service life of the expensive laser bars, the heat sinks are cooled by a coolant, avoiding overheating of the laser bars.

In known laser diode arrangements, a coolant channel that runs along the longitudinal axis of the laser bar is provided below the heat sink. This ensures good cooling in the area where the coolant enters the coolant channel. While passing through the cooling channel, the coolant heats up more and more, such that in the area where coolant exits from the coolant channel, only a small amount of heat can be withdrawn from the heat sink. Thus, the laser bar can overheat locally in this area.

EP-A-O 973 237 discloses a semiconductor laser arrangement with a mounting plate that has a feed channel and discharge channel worked into it. A separate heat sink is provided for each laser diode array which is mounted on the mounting plate. The feed channel and discharge channels are connected to each other via cooling channels that run through each individual heat sink.

JP 2004 193228 A discloses a laser diode arrangement that is mounted on a heat sink. A feed channel and discharge channel for coolant as well as cooling channels that connect the feed to the discharge channel and run close to the laser diodes are provided in the heat sink.

The laser diode arrangement according to EP-A-1 450 454 is designed in a similar manner to the arrangement according to EP-A-O 973 237. Here too a plate is provided with a feed channel and a discharge channel for the coolant worked into it. Likewise, a separate heat sink is provided for each laser diode array and is mounted on the mounting plate. In the same manner, the feed channel and discharge channel are connected to each other via cooling channels that run through each individual heat sink.

SUMMARY OF THE INVENTION

It is the objective of the present invention to provide a laser diode arrangement with a heat sink such that uniform and adequate cooling can take place across the entire arrangement.

According to the invention, this objective is achieved with a laser diode arrangement whereby the cooling element exhibits two coolant channels that run parallel to the longitudinal axis of the heat sink and are designed as a feed channel and discharge channel for a coolant. In addition, numerous cooling channels adjacent to one another are provided that branch off from the feed channel, extend along the heat sink and empty into the discharge channel.

Thus, the coolant flow is already split into numerous cooling channels in the feed channel. These cooling channels run along the traverse axis of the heat sink. For this reason, the path on which the heat energy can be transferred from the heat sink to the coolant is relatively short. Subsequently, there is only little temperature difference of the coolant from one edge of the heat sink to the other edge. Thus, the coolant can take up almost the same quantity of heat from any place on the heat sink. This ensures very uniform cooling and reliably avoids local overheating of the laser bars. Thus, the service life of the laser bars is increased significantly.

Advantageously, a cross-flow channel is formed under the heat sink, parallel to the longitudinal axis, and connects the cooling channels to each other. All the cooling channels empty into this cross-flow channel, which can compensate for the pressure differences between the individual cooling channels. This generates a very uniform coolant flow underneath the heat sink.

It is particularly advantageous if the cooling channels that are directly adjacent to each other branch off at different points of the circumference of the feed channel as well as of the discharge channel and empty at different angles into the cross-flow channel. In this manner, the cooling channels can be placed very close together. The cooling channels can be packed even so tightly that they overlap in the area underneath the heat sink and no longer exhibit separating walls between directly adjacent cooling channels. In the area, where the cooling channels empty into feed channel or the discharge channel, each cooling channel is clearly separated from its respective directly adjacent cooling channel. Thus, each cooling channel is charged with coolant of the same temperature. The coolants of different cooling channels are mixed only downstream of the heat sink.

In an advantageous manner, the heat sink exhibits on its bottom side a profile that extends into the cross-flow channel. The profile serves to enlarge the surface of the heat sink. This allows for more heat energy to be transferred from the heat sink to the coolant. The shape of the profile plays only a subordinate role. However, the profile should be designed such that the flow of the coolant is not excessively restricted. In addition, the profile prevents the build-up of a laminar flow such that a better mixture of the flow layers occurs through the generation of turbulences.

Attached to the cooling element is at least one clamp with which the laser diode is attached to the heat sink and/or the heat sink is attached to the cooling element. Laser diodes are mentioned here as a general term. Of course, the invention can be applied to all types of laser diode arrangements, regardless of the kind of laser diode or type of arrangement. In most cases, numerous laser diodes will be combined already. These laser bars are then attached to the heat sink. Using the clamp, excellent heat transfer between cooling element and heat sink and/or between heat sink and laser diodes can be accomplished in a simple manner. Expensive and time-consuming stages such as soldering or diffusion welding can be avoided. Of course, it is also possible to connect the heat sink to the cooling element in a conventional manner, e.g., by soldering, and to use the clamp only for the connection between the laser diodes and the heat sink. It is also possible to connect the laser diodes first to the heat sink using a soldering process and then to attach the heat sink with the clamp to the cooling element.

However, it is preferred to hold the heat sink and the laser diodes to the cooling element using the clamp.

Preferred is a screw connection between the clamp and the cooling element. In this manner, the clamping force that presses the clamp onto the laser diode can be adjusted very finely. Destroying the laser diode through excessive clamping pressure can be avoided reliably. If the laser diodes are assembled as laser bars, it is prudent to provide a screw for each laser bar. This allows for uniform distribution of the clamping pressure onto the laser bars.

Advantageously, a collimator lens that is connected to the laser diode arrangement is positioned in front of the laser diodes. This design ensures the formation of a complete pre-assembled unit that emits a parallel laser beam. In this manner, appropriate adjustments can be performed easily during pre-assembly of the laser diode arrangement such that the parallelity of the emitted laser beam no longer needs to be checked when installing the laser diode arrangement in a device.

In one exemplary embodiment, the laser diode arrangement is desired to generate a linear light beam. For this purpose, the collimator lens is designed as a rod lens and is dimensioned such that it covers the radiation from all laser diodes. The result is a very uniform, linear laser beam. In contrast to known collimator lenses, this rod lens is designed in one piece. It extends across all assembled laser diodes or laser bars, respectively. Although this presents tougher demands on the accuracy of the alignment of the laser bars than with the use of a collimator lens for each laser bar, this measure can reduce the overall adjustment effort.

Preferred is the provision of a lower adjustment groove for the collimator lens. This adjustment groove can be incorporated into the cooling element. In its bottom area, the position of the rod lens is defined by the lower adjustment groove. A readjustment is then required only in the upper area of the rod lens.

It is particularly advantageous if the collimator lens exhibits a round cross-section. In this manner, an adjustment through the lower adjustment groove is already sufficient. With this lower adjustment groove, a collimator lens with a round cross-section is already fully defined.

Preferably, the collimator lens is also held by the clamp. With a round collimator lens, in particular, the task of the clamp is only to press the collimator lens into the lower adjustment groove and to hold it there.

The part of the clamp that holds the collimator lens is resiliently connected to the part that holds the laser diodes. In this manner, the laser diodes can be mounted without the pressure on the collimator lenses becoming too great, thus preventing a destruction of the collimator lens. The clamp can be designed in one piece, whereby the connection between the two holding components should be sufficiently thin that it exhibits elastic properties. However, the clamp can also have a two-piece design. In this case the two components can be connected to each other with a strip of spring steel, for example.

In one embodiment of the invention, the clamp exhibits an upper adjustment groove for the support of the collimator lens. In particular with a collimator lens that does not have a round cross-section, this measure defines also the upper area of the collimator lens precisely.

In one exemplary embodiment of the invention, the collimator lens is held by its own lens clamp. This offers the advantage that the collimator lens can be mounted fully independent of the laser diodes.

Advantageously, the lens clamp is attached to the clamp or to the cooling element. With an attachment to the clamp, space may become very tight, depending on the power and size of the laser diode arrangement, and can unnecessarily complicate the assembly. In such a case it is often more prudent to enlarge the cooling element somewhat and to attach the lens clamp to the cooling element, similar to the clamp for attaching the laser diodes.

For a full understanding of the present invention, reference should now be made to the following detailed description of the preferred embodiments of the invention as illustrated in the accompanying drawings.

BRIEF DESCRIPTION OF THE DRAWINGS

FIG. 1 shows a side view of a laser diode arrangement, according to a preferred embodiment of the invention, with a section of the cooling element.

FIG. 2 shows a bottom view and rear view of the heat sink of the laser diode arrangement according to the invention.

DESCRIPTION OF THE PREFERRED EMBODIMENTS

Figure 3:
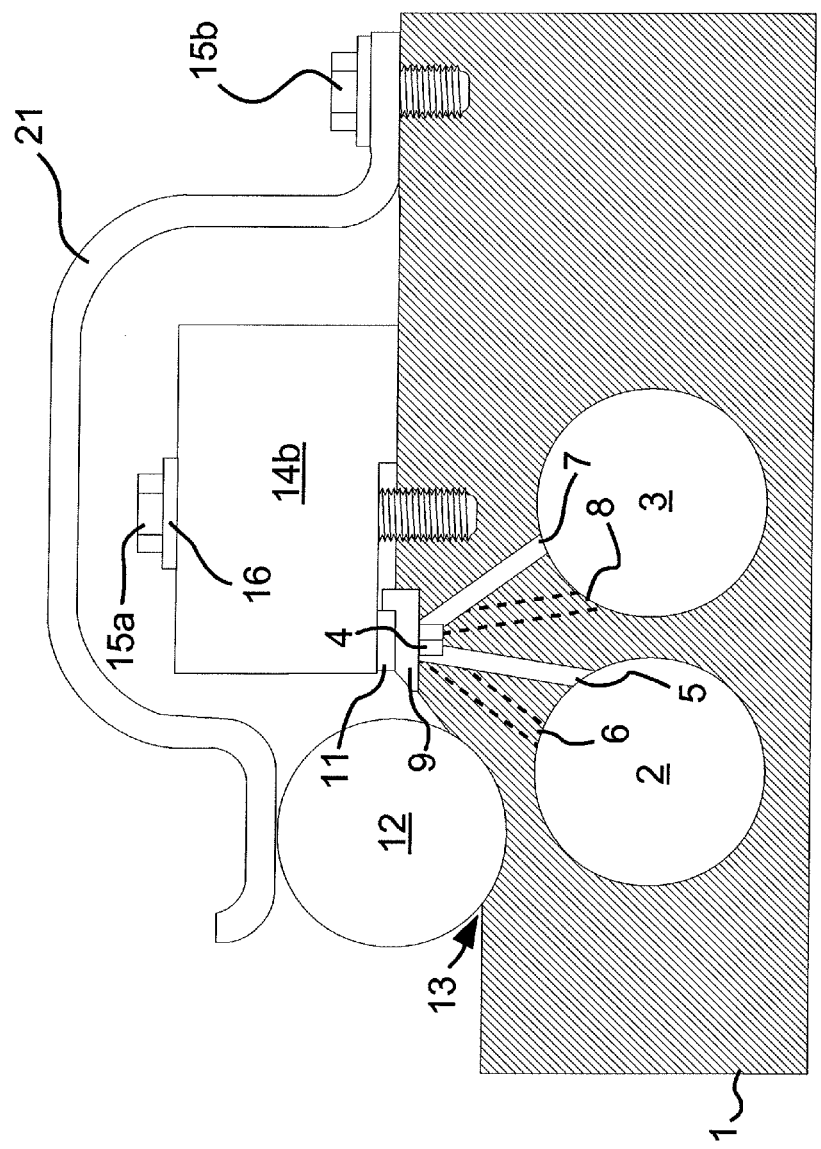
FIG. 3 shows another preferred embodiment of the present invention.

The preferred embodiments of the present invention will now be described with reference to FIGS. 1-3 of the drawings. Identical elements in the various figures are designated with the same reference numerals.

FIG. 1 presents the laser diode arrangement, according to the invention, with a section of the cooling element 1, in such a way that the coolant guidance channels are visible. The latter include a feed channel 2, a discharge channel 3, a cross-flow channel 4 and numerous cooling channels 5, 6, 7, 8. The coolant is fed into the feed channel 2 through a connection (not shown here). The coolant is then withdrawn through the adjacent discharge channel 3. The feed channel 2 and the discharge channel 3 are connected to each other via cooling channels 5, 6, 7 8.

The heat sink 9 is mounted on the cooling element 1 such that it closes the cross-flow channel at the top. The cross-flow channel 4 is connected to the feed channel 2 via the first and second feeding cooling channels 5, 6. The connection between the cross-flow channel 4 and the discharge channel 3 is established via the first and second discharging cooling channels 7, 8. The first feeding channels 5 empty into the cross-flow channel 4 at a different angle from that of the second feeding cooling channels 6, and in the same manner, the first discharge channels 8 empty into the cross-flow channel 4 at a different angle from that of the second discharging cooling channels 7. Because the respective first and second feeding cooling channels 5, 6 are each attached at different points on the circumference of the feed channel 2, and the first and second discharging cooling channels 7, 8 each at different points on the circumference of the discharge channel 3, the cooling channels 5, 6 or 7, 8, respectively, can be packed so tightly that they may even overlap in the area of the cross-flow channel 4. There are no separating walls between the cooling channels 5, 6 or 7, 8, respectively, in this overlapping area.

As shown in FIG. 2, the heat sink 9 is provided with a profile 10 at its bottom side. In the shown preferred embodiment, the profile 10 has a saw tooth design, for example. However, other profiles, for example, a rectangular profile, can be used as well. Through the profile 10, the surface of the heat sink 9, which comes in contact with the coolant, should be enlarged such that a greater quantity of heat can be transferred from the heat sink 9 to the coolant.

The profile 10 should also serve to avoid the formation of a laminar flow between the feeding cooling channels 5, 6 and the discharging cooling channels 7, 8. With a laminar flow, the layered structure would be maintained and the coolant in the top flow layer would not mix with the underlying cooler flow layers. Thus, the top flow layer would reach a higher temperature and would take up less heat energy.

The laser bars 11 are mounted on the heat sink 9. For example, three laser bars can be arranged next to each other on the heat sink 9. At its front edge, the heat sink 9 is beveled downwards such that the radiation of the emitted laser light is not restricted.

Located in front of the laser bar 11, viewed in the radiation direction, is a rod lens 12. The rod lens 12 acts as a collimator lens and parallelizes the laser light emitted by the laser diodes in the slow scan direction. In the fast scan direction, the neighboring laser diodes provide uniform cross-illumination such that a harmonized, linear laser beam is generated. The rod lens 12 is located in a lower adjustment groove 13 and is thus already fully defined.

The laser diode arrangement is held together by a clamp 14a. For this purpose, the bottom side of the clamp 14a is divided into three stages. The right stage rests on the cooling element 1 and forms the base of the clamp 14a. The central stage presses on the laser bars 11. In this manner, the clamp 14a not only holds the laser bars 11 in full-area contact with the heat sink 9 but also presses the heat sink 9 with great force onto the cooling element 1, such that the cross-flow channel 4 is sealed. However, sealing material may be used as well for better sealing of the cross-flow channel. In this manner, there is no need for any other connection method between the heat sink 9 and the cooling element 1 or between the laser bars 11 and the heat sink 1.

The pressure of the clamp 14a onto the laser bars 11 must be exerted in a completely uniform fashion such that good heat transfer from the laser bars 11 to the heat sink 9 is possible. Here, the smallest irregularities can already cause local overheating and lead to destruction of the laser bars 11.

Screws 15a are provided to be able to set a uniform pressure of the clamp 14a. These screws protrude through a bore hole in the clamp 14a and are anchored in a threaded hole in the cooling element 1. Insulating disks 16 are provided to prevent the clamp 14a from moving when the contacting screw head is turned as the screws 15a are tightened. The disks can be made of a heat-resistant, high-strength plastic but also of ceramic material.

The left stage of the clamp 14a serves as the support of the rod lens 12. It is designed as a holding component 19 for the rod lens 12. The connection between the holding component 18 for the laser bars 11 and the holding component 19 for the rod lens 12 is designed as a spring bar 20. The spring bar 20 should enable clamping of the laser bars 11 without exerting too much pressure on the rod lens 12. Thus, to a limited degree, clamping of the rod lens 12 and of the laser bars 11 are independent of each other. In the shown exemplary embodiment, the clamp 14a is designed in one piece, whereby the connection between the two holding components 18 and 19, designed as a spring bar 20, should be sufficiently thin such that it exhibits elastic properties.

The clamp 14a could also have a two-piece design. In this case the two holding components 18 and 19 would have to be connected to each other with a spring clip or a strip of spring steel, for example.

In the shown exemplary embodiment, the upper adjustment groove 17 is integrated into the holding component 19 for the rod lens 12. However, for a rod lens with a round cross-section, this upper adjustment groove 17 is not absolutely necessary because the rod lens is already defined precisely by the lower adjustment groove 13. Here, it would be sufficient if the holding component 19 were provided with a straight bottom side.

However, with a rod lens with an elliptical cross-section designed as a regular converging lens, the upper area must be secured precisely as well because the position of this rod lens is not yet defined sufficiently by the lower adjustment groove. For this situation, the upper adjustment groove 17 in the clamp 14a is of particular significance.

However, exact positioning of such a rod lens using the upper adjustment groove 17 can occur only if the clamp 14a is positioned precisely as well. For this purpose, the right stage at the bottom side of clamp 14a can be designed slightly higher. A groove of a respective depth and with funnel-shaped beveled side walls is machined into the cooling element 1. The width of the groove bottom corresponds precisely to the width of the right stage of clamp 14a.

When tightening the screws 15a, only the right stage of the clamp with its lower boundary surface is pressed to the bottom of the groove and is centered by the beveled side walls in this groove. The position of the clamp 14a, and with it the position of the rod lens, is thus secured precisely.

A flange is molded to the back side of the heat sink 9 to be able to position the laser bars 11 precisely as well. Prior to tightening of the screws 15a, the laser bars 11 can be positioned tightly against this stage-like flange.

However, it is also possible to use a heat sink without a stage-like flange. In this case, an assembly jig is used for positioning of the laser bars 11. The assembly jig can include a front and a rear guide bar and can be screwed together at the sides of the cooling element 1. After the screws 15a have been tightened, the assembly jig can be removed.

Should a readjustment of the rod lens 12 become necessary due to greater tolerances when manufacturing the laser bars, the cooling element 1 can be modified accordingly. For this purpose, the lower adjustment groove 13 is provided in a separate component. This component is connected with the cooling element 1 via an adjustment device.

FIG. 3 shows a different preferred embodiment of the present invention. Here, clamp 14b is intended solely for supporting the laser bars 11. A separate lens clamp 21 is provided for supporting the rod lens 12. This lens clamp 21 is also attached to the cooling element 1 using a screw 15b. Advantageously, the lens clamp is made of spring steel and exhibits pre-tensioning, which presses the rod lens 12 into the lower adjustment groove 13 when the screw 15b is tightened.

With this exemplary embodiment, the laser bars 11 are first mounted using the clamp 14b. In this case, the rod lens 12 can be attached completely independently using the lens clamp 21.

There has thus been shown and described a novel laser diode arrangement which fulfills all the objects and advantages sought therefor. Many changes, modifications, variations and other uses and applications of the subject invention will, however, become apparent to those skilled in the art after considering this specification and the accompanying drawing which discloses the preferred embodiment thereof. All such changes, modifications, variations and other uses and applications which do not depart from the spirit and scope of the invention are deemed to be covered by the invention, which is to be limited only by the claims which follow.

The invention claimed is:

1. Power semiconductor arrangement comprising, in combination:

(a) a plurality of power semiconductor devices arranged next to each other forming a linear array;

(b) an elongate heat sink on which the semiconductor devices are mounted, said heat sink having a longitudinal axis;

(c) a cooling element that is in close contact with the heat sink, wherein the cooling element has two linear coolant channels that extend parallel to the longitudinal axis of the heat sink and are designed as a feed channel and as a discharge channel, respectively, for a fluid coolant; and (d) a plurality of linear cooling channels that are located next to each other, and which branch off from the feed channel, run alongside the heat sink and thereafter empty into the discharge channel, wherein cooling channels that are located directly adjacent to one another branch off at different points around the circumference of the feed channel and terminate at different points around the circumference of the discharge channel.

2. A power semiconductor arrangement as set forth in claim 1, wherein a cross-flow channel is formed under the heat sink parallel to its longitudinal axis, said cross-flow channel connecting the cooling channels to one another.

3. A power semiconductor arrangement as set forth in claim 2, wherein cooling channels that are located directly adjacent to one another empty into the cross-flow channel at different angles.

4. A power semiconductor arrangement as set forth in claim 3, wherein the heat sink exhibits at its bottom side a profile that extends into the cross-flow channel.

5. A power semiconductor arrangement as set forth in claim 4, wherein at least one clamp is attached to the cooling element, said clamp being used to attach at least one of (1) the power semiconductor to the heat sink and (2) the heat sink to the cooling element.

6. A power semiconductor arrangement as set forth in claim 5, wherein the clamp is screwed together with the cooling element.

7. A power semiconductor arrangement as set forth in claim 1, wherein the semiconductor devices are laser diodes.

8. A power semiconductor arrangement as set forth in claim 7, wherein a collimator lens that is connected to the laser diode arrangement is positioned in front of the laser diodes.

9. A power semiconductor arrangement as set forth in claim 8, wherein the collimator lens is designed as a rod lens, which is dimensioned such that it covers the light from all laser diodes.

10. A power semiconductor arrangement as set forth in claim 9, wherein a lower adjustment groove is provided in the cooling element for receiving the collimator lens.

11. A power semiconductor arrangement as set forth in claim 10, wherein the collimator lens exhibits a round cross-section.

12. A power semiconductor arrangement as set forth in claim 9, wherein the collimator lens is held by the clamp.

13. A power semiconductor arrangement as set forth in claim 12, wherein a part of the clamp that holds the collimator lens is connected resiliently to a part that holds the laser diodes.

14. A power semiconductor arrangement as set forth in claim 12, wherein the clamp has an upper adjustment groove for holding the collimator lens.

15. A power semiconductor arrangement as set forth in claim 9, wherein the collimator lens is held by a lens clamp.

16. A power semiconductor arrangement as set forth in claim 15, wherein the lens clamp is attached to the clamp.

17. A power semiconductor arrangement as set forth in claim 15, wherein the lens clamp is attached to the cooling element.

18. A power semiconductor arrangement as set forth in claim 1, wherein said feed channel and said discharge channel are substantially equidistant from the heat sink.

* * * * *